US008861236B2

(12) United States Patent
Remmert

(10) Patent No.: US 8,861,236 B2
(45) Date of Patent: Oct. 14, 2014

(54) SWITCHING POWER SUPPLY WITH SELF-OPTIMIZING EFFICIENCY

(75) Inventor: Guido Remmert, Hamm (DE)

(73) Assignee: Phoenix Contact GmbH & Co., KG (DE)

( * ) Notice: Subject to any disclaimer, the term of this patent is extended or adjusted under 35 U.S.C. 154(b) by 547 days.

(21) Appl. No.: 13/059,503

(22) PCT Filed: Apr. 29, 2009

(86) PCT No.: PCT/EP2009/006243
§ 371 (c)(1),
(2), (4) Date: Jun. 2, 2011

(87) PCT Pub. No.: WO2010/022959
PCT Pub. Date: Mar. 4, 2010

(65) Prior Publication Data
US 2012/0112720 A1 May 10, 2012

(30) Foreign Application Priority Data
Aug. 28, 2008 (DE) .......................... 10 2008 044 662

(51) Int. Cl.
| H02M 1/42 | (2007.01) |
| H03K 17/14 | (2006.01) |
| H02M 3/28 | (2006.01) |
| H02M 1/00 | (2006.01) |
| H02M 3/335 | (2006.01) |

(52) U.S. Cl.
CPC ......... *H03K 17/14* (2013.01); *H02M 2001/007* (2013.01); *Y02B 70/1475* (2013.01); *H02M 3/33592* (2013.01); *H02M 1/4225* (2013.01); *H02M 3/28* (2013.01); *H03K 2217/0036* (2013.01); *Y02B 70/126* (2013.01)
USPC .............. 363/89; 323/207; 323/266; 323/299

(58) Field of Classification Search
USPC .................. 363/40, 41, 74, 79, 89, 90, 95, 97; 323/207, 266, 299
See application file for complete search history.

(56) References Cited

U.S. PATENT DOCUMENTS

| 5,475,296 A | 12/1995 | Vinsant et al. |
| 6,807,073 B1 | 10/2004 | Scarlatescu |

(Continued)

FOREIGN PATENT DOCUMENTS

| DE | 102005050401 | 4/2007 |
| EP | 1569323 | 8/2005 |

(Continued)

OTHER PUBLICATIONS

Office Action dated Aug. 31, 2012 corresponding to European Patent Application No. 09 778 174.4-2215.

(Continued)

*Primary Examiner* — Gary L Laxton
*Assistant Examiner* — Afework Demisse
(74) *Attorney, Agent, or Firm* — Ohlandt, Greeley, Ruggiero & Perle, LLP

(57) ABSTRACT

A switching power supply is provided that includes: input terminals for the uptake of an input power, output terminals for providing an output power, a circuit disposed between the input and output terminals for transforming the input power and having at least one controllable switch, a control unit for controlling the at least one controllable switch by means of at least one pulse-width modulation signal having variable frequency and variable duty cycle, and having measuring instruments connected to control unit, designed for at least measuring the input current intensity, the input voltage, the output current intensity, and the output voltage, wherein control unit is designed for the purpose of monitoring the efficiency of switching power supply by means of measurement values of the connected measuring instruments, and of optimizing the efficiency by controlling the at least one controllable switch by means of a first digital control loop. Also provided is a method for operating a switching power supply.

19 Claims, 4 Drawing Sheets

(56) References Cited

U.S. PATENT DOCUMENTS

| | | | |
|---|---|---|---|
| 7,102,300 B2 * | 9/2006 | Chieh et al. | 315/291 |
| 7,629,699 B2 * | 12/2009 | Annen et al. | 290/1 A |
| 7,977,921 B2 * | 7/2011 | Bahai et al. | 320/140 |
| 2004/0189271 A1 | 9/2004 | Hansson et al. | |
| 2005/0041446 A1 * | 2/2005 | Harnett et al. | 363/95 |
| 2006/0138973 A1 | 6/2006 | Hirosawa | |

FOREIGN PATENT DOCUMENTS

| | | |
|---|---|---|
| EP | 1569323 A2 | 8/2005 |
| JP | 2001298955 A | 10/2001 |
| JP | 2002064973 A | 2/2002 |
| JP | 2003244962 A | 8/2003 |
| JP | 2004282847 A | 10/2004 |
| JP | 2006136042 A | 5/2006 |
| JP | 2006187115 | 7/2006 |
| JP | 2006304430 A | 11/2006 |

OTHER PUBLICATIONS

English Translation of International Preliminary Report on Patentability dated Mar. 10, 2011 corresponding to International Patent Application No. PCT/EP2009/006243.

International Search Report dated Nov. 23, 2009 corresponding to International Patent Application No. PCT/EP09/06243.

Office Action dated Feb. 28, 2013 corresponding to Chinese Patent Application No. 200980134029.6, 13 pp.

English translation of Japanese Office Action dated Sep. 10, 2013 corresponding to Japanese Patent Application No. 2011-524255, 3 pp.

Japanese Office Action dated Jun. 24, 2014 corresponding to Japanese Patent App. No. 2011-524255, 7 pp.

* cited by examiner

SWITCHING POWER SUPPLY WITH SELF-OPTIMIZING EFFICIENCY

BACKGROUND OF THE DISCLOSURE

1. Field of the Disclosure

The invention in general relates to the field of power supply technology and in particular to that of switching power supply technology.

2. Description of the Related Art

Switching power supplies are electronic modules that serve for transforming current and voltage and are widely used, for example, as computer or connector power supplies. However, switching power supplies also find use in many other fields of application. In particular, constant output voltages or currents are produced from an unstabilized input voltage by means of switching power supplies. The constancy of the output values is achieved by controlling the energy flow into the switching power supply by means of a control loop. The regulation is typically produced by means of time-controllable switches, which are designed, for example, as transistors.

Switching power supplies clearly achieve higher efficiencies in comparison to conventional power supplies. Since for switching power supplies, in particular with the use of synchronous rectifiers, a precise time control of the transistors functioning as switches must occur, dead times are typically provided in order to avoid short-circuit-like states, which are also called "shoot through" states. The dead times must be dimensioned sufficiently long in order to take into account effects such as variation in load, temperature drift, aging drift and component tolerance. The achievable efficiency of a switching power supply is limited, however, due to the long dead times.

Switching power supplies advantageously have a large tolerance range with respect to the voltage applied at the input and the load connected at the output, but a lower efficiency is typically achieved with low input voltages and small loads.

SUMMARY OF THE DISCLOSURE

The object of the invention is thus to indicate a way by which the efficiency of a switching power supply can be increased, in particular over a wide range of input voltages and loads. Another object of the invention is to provide a switching power supply that has a high long-term stability and high regulation performance.

Correspondingly, a switching power supply according to the invention comprises input terminals for receiving an input voltage and/or of an input current, output terminals for providing an output voltage and/or an output current, as well as a circuit for current and/or voltage transformation that is disposed between the input and output terminals, this circuit having at least one controllable switch. A control unit is provided for controlling the at least one controllable switch, this unit being designed for the purpose of controlling the switches by means of at least one pulse-width modulation signal having variable frequency and variable duty cycle. Further, measuring instruments are connected to the control unit, and these are designed for at least measuring the input current intensity, the input voltage, the output current intensity, and the output voltage, the control unit being designed for the purpose of monitoring the efficiency of the switching power supply by means of measurement values of the connected measuring instruments, and to optimize the efficiency by controlling the at least one controllable switch by means of a first digital control loop. For this purpose, the control unit particularly advantageously comprises a digital signal processor.

Advantageously, the circuit of the switching power supply that is disposed between the input and output terminals comprises several circuit components, in particular a first circuit component for power factor correction, a second circuit component connected downstream of the first component and designed as a d.c. voltage transformer, and a third circuit component connected downstream of the second component and designed as a synchronous rectifier. Preferably, the first, second and third circuit components each have at least one switch that can be controlled by the control unit. Further, the invention advantageously also comprises embodiments in which at least one of the circuit components has several switches that can be controlled via the control unit.

For operation at an a.c. voltage supply, at least one other circuit component for rectifying the a.c. voltage is preferably connected upstream of the first circuit component for the power factor correction. In this embodiment, the corresponding values can be measured advantageously as the input current intensity and input voltage after rectification has occurred. The measuring instruments for measuring the input current intensity and the input voltage are then advantageously disposed between the input-side circuit component for rectification and the downstream-connected circuit component for the power factor correction.

The circuit component for the power factor correction is preferably designed as an active harmonic filter and comprises a step-up transformer, which charges a capacitor to a voltage above the peak voltage of the a.c. supply voltage and thus a d.c. voltage is provided as an intermediate circuit voltage at the output of this circuit component. The current consumption is readjusted to the course of the input voltage, so that contaminants of the network due to harmonics of downstream-connected circuit components are avoided. This control takes place preferably by means of a first switch which is disposed in the first circuit component and which is controlled via the control unit. The intermediate circuit voltage produced by the first circuit component particularly advantageously can be adjusted and/or controlled by controlling the first switch via the control unit, whereby the control is effected by means of a first pulse-width modulation signal.

The d.c. voltage transformer preferably connected downstream of the circuit component for the power factor correction comprises a second switch that can be controlled via the control unit, and this second switch serves for controlling the energy consumption of the switching power supply and, for this purpose, switches the intermediate circuit voltage with an adjustable switching frequency and an adjustable duty cycle, whereby, for this purpose, the second switch is controlled by the control unit by means of a second pulse-width modulation signal.

The pulsed voltage produced by the d.c. voltage transformer is preferably rectified by means of a downstream-connected synchronous rectifier. The synchronous rectifier preferably has at least one third switch that can be controlled via the control unit as a rectifier element. The circuit can further comprise a transformer for electrical separation from the power grid. The control loop preferably comprises at least one opto-coupler in this case.

The controllable switches are preferably designed as MOSEFTs (Metal-Oxide Semiconductor Field-Effect Transistors). However, for example, bipolar transistors, IGBTs (Insulated Gate Bipolar Transistors) or other suitable electronic components such as thyristors, for example, can be employed. Advantageously, the first and second switches can be controlled by the control unit in such a way that these switches operate as the PID controller of the first control loop.

For the regulation, the switches are each controlled by the control unit by means of a pulse-width modulation signal. Advantageously, the pulse-width modulation signals, by means of which the control unit controls each of the first, second and third switches, have the same frequency, but different phases.

A separate power-factor pre-control can be provided alternatively in one advantageous embodiment, wherein the first switch, which is disposed in the circuit component for the power factor correction, is actuated with a pulse-width modulation signal whose frequency is controlled separately by the control unit, independently from the pulse-width modulation signals for the control of the second and third switches.

The frequency of the pulse-width modulation signals and thus the switching frequency of the switches preferably lies above the upper auditory threshold, typically in a range between 20 kHz and 500 kHz.

In order to optimize the efficiency, the following are preferably controlled as the manipulated variable of the first control loop: the frequency of the pulse-width modulation signals, and/or the intermediate circuit voltage produced by the circuit component for the power factor correction, and/or the phase difference between the pulse-width modulation signals for controlling the first and second switches, and/or the phase difference between the pulse-width modulation signals for controlling the second and third switches.

The inventors have recognized that a regulation of the frequency of the pulse-width modulation signals can be utilized particularly advantageously for optimizing the efficiency when only small loads are connected to the output terminals of the switching power supply. Further, the inventors have recognized that a regulation of the intermediate circuit voltage can be utilized particularly advantageously for optimizing the efficiency when the supply voltage connected to the input terminals of the switching power supply varies and assumes particularly low values.

In order to control the intermediate circuit voltage for optimizing the efficiency, measuring instruments are preferably connected to the control unit, and these serve for measuring the intermediate circuit voltage produced by the circuit component for the power factor correction and applied on the input side at the d.c. voltage controller and for measuring the current intensity of the current flowing on the input side at the d.c. voltage controller.

Since the temperature of corresponding components of the circuit increases when power losses occur, and a change in temperature has an effect on the behavior of the components, a measuring instrument connected to the control unit is also advantageously provided for measuring at least one temperature of the circuit, in particular, a temperature in the vicinity of one of the controllable switches.

Dead times are produced by the phase differences between the pulse-width modulation signals, and these dead times reduce the efficiency of the switching power supply. A reduction in these dead times, however, is particularly critical, especially with synchronous rectifiers at high switching frequencies, due to the danger of generating short-circuit-like conditions, which are also called "shoot through" conditions. A reliable distance from the "shoot through" point must be maintained, since otherwise, considerable power losses would occur.

Therefore, a second control loop that is slower than the first is controlled with particular advantage by the control unit. Preferably, the temperature is monitored by the control unit during the execution of the first control loop and a control by means of the second control loop will begin only after the temperature has stabilized. Alternatively or additionally, the control by means of the second control loop will preferably begin only after the efficiency has stabilized.

The phase difference between the pulse-width modulation signals for control of the first and second switches and/or the phase difference between the pulse-width modulation signals for control of the second and third switches and thus the corresponding dead times is advantageously controlled by the second control loop.

The efficiency of the switching power supply and/or the temperature is preferably used by the control unit as the reference variable of the second control loop.

The above-described manipulated variables of the first and/or second control loop can be advantageously adjusted to a nearly optimal value by means of fields of characteristic curves. Correspondingly, when the switching power supply is turned on and/or when there is a change in the voltage applied to the input terminals, and/or when there is a change in the load connected to the output terminals, the manipulated variables of the first and/or second control loop are preferably adjusted based on the fields of characteristic curves for the semiconductor components utilized in the circuit that are stored in the switching power supply.

A soft start, which serves as a starting current limitation, is preferably provided at first when the switching power supply is turned on. This can be produced advantageously by an appropriate control of the first switch disposed in the circuit component for the active power factor correction.

A method for operating a switching power supply as described above also lies within the scope of the invention.

BRIEF DESCRIPTION OF THE DRAWINGS

The invention will be described more precisely below by way of example, based on preferred embodiments and with reference to the appended drawings. The same reference numbers in the drawings designate the same or similar components.

Herein:

FIG. 2b: shows schematically a power loss that occurs in dependence of a dead time that can be adjusted by the phase difference of the pulse-width modulation signals produced at the outputs PWM2 and PWM3 shown in FIG. 1, FIG. 3a: shows schematically a switching frequency in dependence of a load connected to the output of a switching power supply for a conventional switching power supply and for the switching power supply shown in FIG. 1, FIG. 3b: shows schematically the efficiency to be achieved with the switching frequencies shown in FIG. 2a, FIG. 4a: shows schematically an intermediate circuit voltage in dependence of an input voltage applied at the input of a switching power supply for a conventional switching power supply and for the switching power supply shown in FIG. 1, and FIG. 4b: shows schematically the efficiency to be achieved with the intermediate circuit voltages shown in FIG. 3a.

DESCRIPTION OF THE DISCLOSURE

Figure 1:
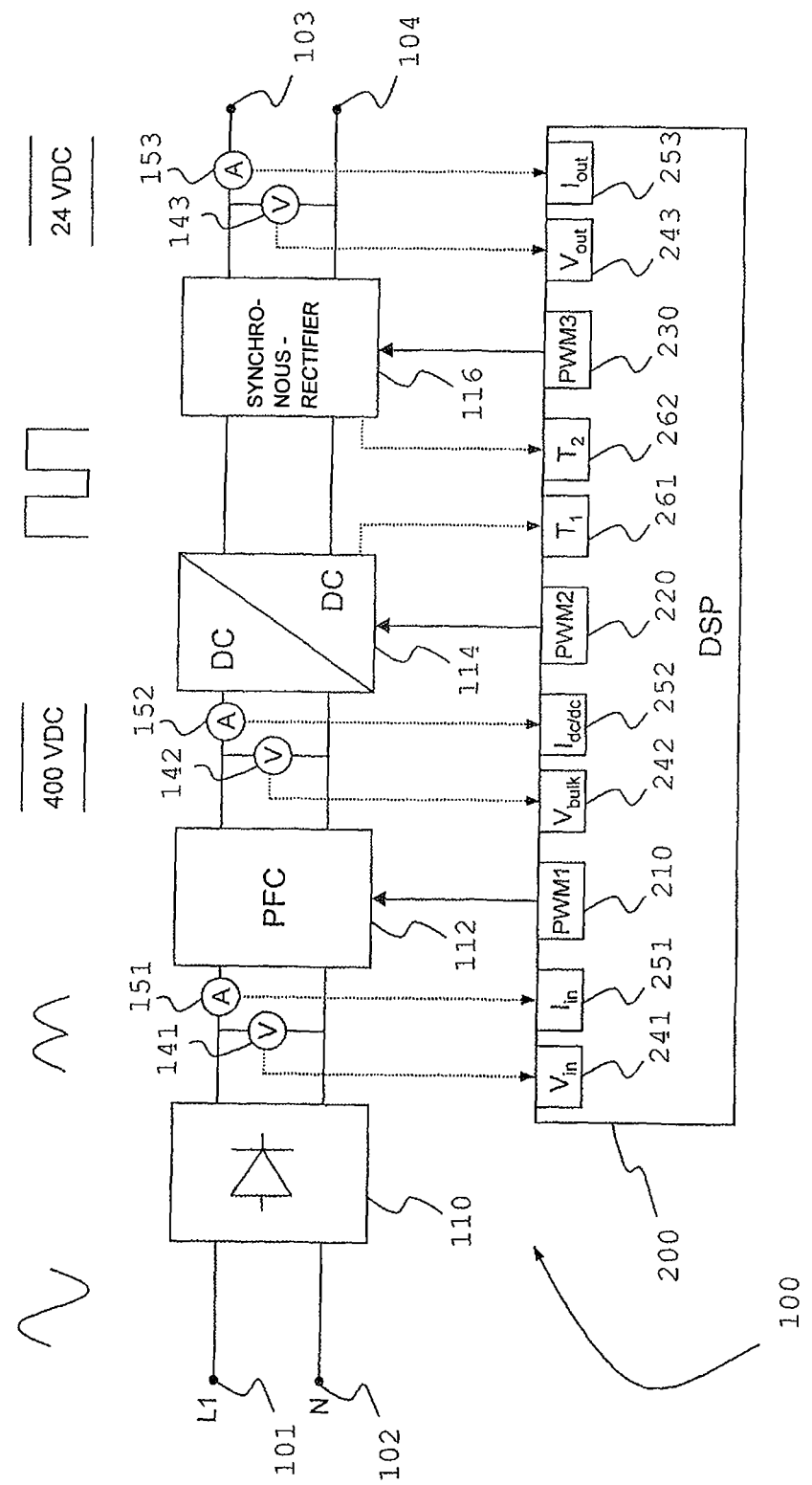
FIG. 1: shows a schematic block diagram of a preferred embodiment of a switching power supply according to the invention.

FIG. 1 shows a schematic block diagram of a circuit of a preferred embodiment of a switching power supply 100 according to the invention. The circuit comprises two input terminals 101 and 102 for connecting switching power supply 100 to a voltage supply, preferably to the supply voltage of an a.c. power grid, for example, the current network utilized in Germany with the standard voltage of 230 V or the current network utilized on the American continent with a rated value for the a.c. network voltage typically between 110 V and 120 V.

In the embodiment of switching power supply 100 that is shown, the latter comprises a rectifier circuit 110, which is connected to input terminals 101 and 102, whose outputs are connected to a component 112 for power factor correction, also abbreviated as PFC (Power Factor Correction) below. PFC 112 supplies an intermediate circuit voltage for the downstream-connected d.c. voltage transformer 114, also called a DC/DC converter in the following. The pulsed voltage produced by the DC/DC converter is supplied to a synchronous rectifier 116, which provides a d.c. voltage at output terminals 103 and 104 of switching power supply 100, which amounts to 24 V in the example of embodiment shown. In order to match the voltage and for electrical separation, a transformer is also advantageously provided, which can be disposed, for example, in DC/DC converter 114. The signal forms between the individual components are shown by way of example above the circuit in FIG. 1.

In order to regulate switching power supply 100, a control unit 200 is provided, which controls first, second and third controllable switches by means of first, second and third pulse-width modulation signals, the switches preferably being designed as MOSFETs and the first switch being disposed in PFC 112, the second switch in the DC/DC converter, and the third switch in synchronous rectifier 116. For providing the pulse-width modulation signals, control unit 200 has corresponding outputs 210, 220 and 230, designated PWM1, PWM2 and PWM3, each of which is connected with the gate connections of the first, second or third switch. In alternative embodiments, components 112, 114 and 116 may also each comprise several switches, each of which is controlled by means of a common pulse-width modulation signal or by separate signals.

Control unit 200 also comprises signal inputs 241, 242, 243, 251, 252, 253, 261 and 262 for recording measuring signals, wherein an A/D converter is preferably assigned to each signal input in order to convert analog measuring signals. Signal inputs 241, 251, 243 and 253 serve for measuring the input voltage, the input current, the output voltage, and the output current. For this purpose, signal input 241 is connected to voltmeter 141, signal input 251 to ammeter 151, signal input 243 to voltmeter 143, and signal input 253 to ammeter 153.

Among other things, the control unit converts the measurement values obtained via the signal inputs 241, 251, 243 and 253 into an efficiency, wherein the multiplied output values divided by the multiplied input values yield the efficiency. The necessary calculations are performed by a digital signal processor disposed in control unit 200, which is also abbreviated DSP below. In addition, the temperature of the circuit of switching power supply 100 is monitored, preferably in the vicinity of relevant components of the circuit. For this purpose, in the example of embodiment shown, two temperatures are measured by means of suitable sensors and the measuring signals are introduced into control unit 200 via the corresponding signal inputs 261 and 262. The first sensor is disposed in DC/DC converter 114, preferably in the vicinity of the second switch, and the second sensor is disposed in synchronous rectifier 116, preferably in the vicinity of the third switch. The efficiency η(Eta) and the temperatures of the power semiconductors are measured constantly inside switching power supply 100.

The intermediate circuit voltage and the primary DC/DC current are also measured in the example of embodiment shown. For this purpose, signal input 242 of control unit 200 is connected to voltmeter 142 and signal input 252 is connected to ammeter 152.

Based on the measurement values, control unit 200 controls at least one control loop, wherein the DSP utilizes as output the three outputs 210, 220 and 230, in order to control PFC 112, DC/DC converter 114 and synchronous rectifier 116 by these outputs. Two digital controllers are basically programmed in the encrypted DSP software of control unit 200, one for PFC stage 112 and one for DC/DC converter 114. Further, there are different delay times for synchronous rectifier 116 and also a field of characteristic curves in the software.

The control by means of the pulse-width modulation signals that are output via outputs 210, 220 and 230 is usually produced with only one synchronized switching frequency, but this is not mandatory for the control of PFC 112. In the example of embodiment shown, the switching frequencies of the pulse-width modulation signals that are output via outputs PWM2 and PWM3 are, in fact, synchronous, but phase-shifted. The phase shift, i.e., the dead time, for synchronous rectifier 116 is controlled by the DSP of control unit 200. Further, the DSP controls PFC stage 112 and DC/DC converter 114.

Control unit 200 utilizes the pulse-width modulation signals, with which the upstream-connected booster (PFC) 112, DC/DC converter 114 and synchronous rectifier 116 are controlled, for adjusting the manipulated variables of a control loop, these variables comprising the switching frequency, the dead time, in particular for synchronous rectifier 116, and the intermediate circuit voltage.

The efficiency can be positively influenced by means of the measurement values and the manipulated variables. This will be presented in the following.

Figure 2A:
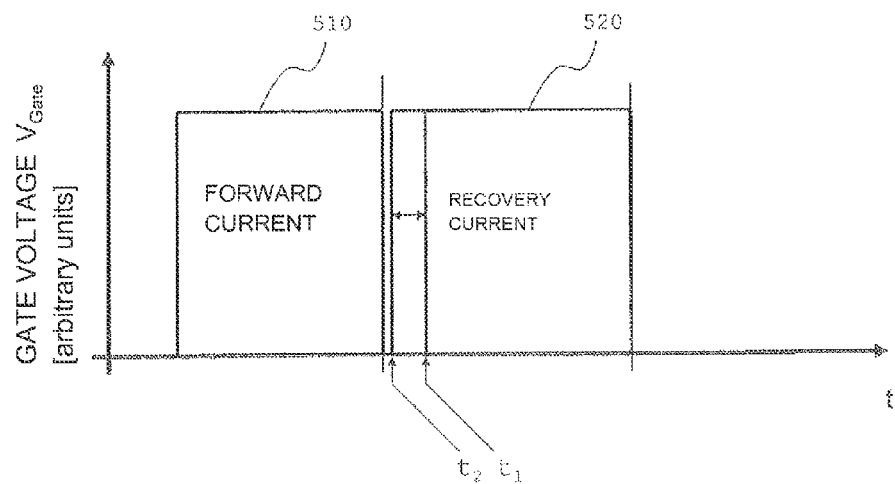
FIG. 2a: shows schematically specific gate voltages over time for differently adjusted dead times.
Figure 2B:
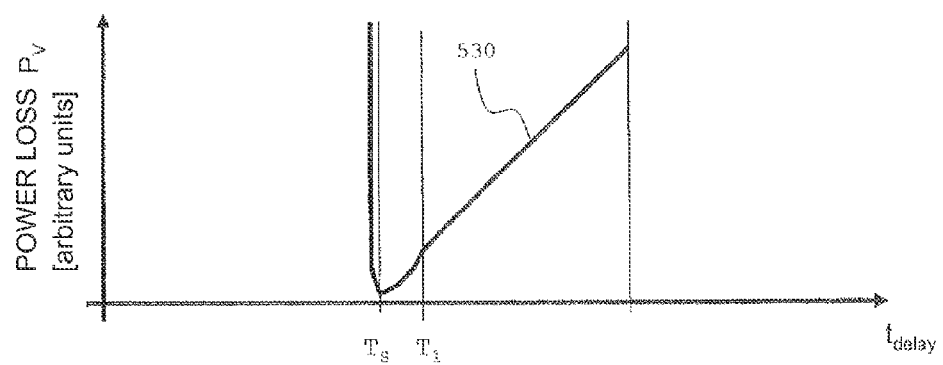

When a synchronous rectifier is used, typically phases in which a forward current or a recovery current flows are alternated by appropriate switching of the second and third switches. The gate voltages 510 and 520 of the second and third switches produced by the pulse-width modulation signals PWM2 and PWM3 are shown in FIG. 2*a*. In conventional switching power supplies, due to the dead time $T_1$ shown, for example, in FIG. 2*b*, the phase of the recovery current is established at time point $t_2$. By a reduction in the dead time according to the invention, this time point is shifted, for example to $t_2$, whereby the power loss that occurs is reduced. The power loss 530 that occurs due to the resulting dead times is shown in FIG. 2*b*. Control of dead times with synchronous rectifiers having high switching frequencies is particularly critical, since one requires a reliable distance from the "shoot through" point, shown in FIG. 2*b* as dead time $T_s$.

Without the invention, the variation in load, temperature drift, aging drift and component tolerance must be considered here. Aging drift and component tolerance can be directly eliminated by the invention. By means of a stored field of characteristic curves, switching power supply 100 can be automatically adjusted, at first close to the optimal switching point relative to load and temperature.

With a slow temperature control loop and/or a rapid real-time measurement of the efficiency, in fact, the optimal point is reached, since the digital controller keys in the optimal point after each change in load or temperature.

Higher switching frequencies are always possible due to MOSFETs and diodes that are continually faster, so that increasingly smaller magnetics can be developed. With increasing switching frequency and thus shorter periods with constant dead times, however, conventionally controlled power supplies would be inefficient, since the "useful" switching time is continually shorter. By means of control unit 200, in contrast, the dead time will be optimally adjusted and optimized in fact in continuing operation.

Figure 3A:
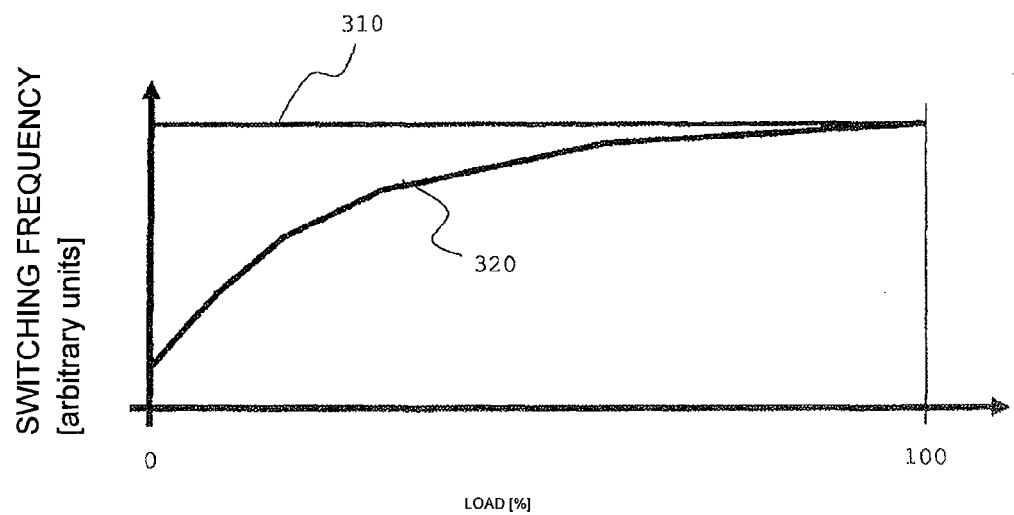
Figure 3B:
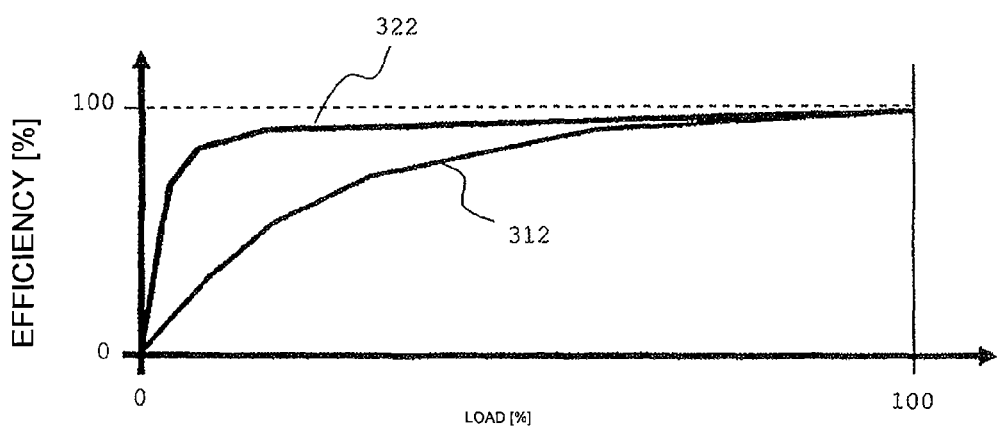

In conventional switching power supplies in which pulse-width modulation signals with a fixed switching frequency are used, the switching and recharging losses become increasingly greater with a continually decreasing load. The switching frequency can be lowered to just under the audible range by means of control unit 200 for each field of characteristic curve with a smaller load, and thus the losses can be drastically reduced. This is preferably provided synchronously, of course, for PFC 112, DC/DC converter 114 and synchronous rectifier 116. The obtainable improvement in the efficiency is presented, for example, in FIGS. 3a and 3b. A constant switching frequency 310 of a conventional switching power supply and of a switching frequency 320 adapted to the load according to the invention as a function of the load connected at the output of the respective switching power supply in percent of a maximum load is shown in FIG. 3a. The efficiencies 312 and 322 that can be obtained in each case as a function of the connected load are shown in FIG. 3b for a conventional switching power supply and for a switching power supply according to the invention.

Figure 4A:
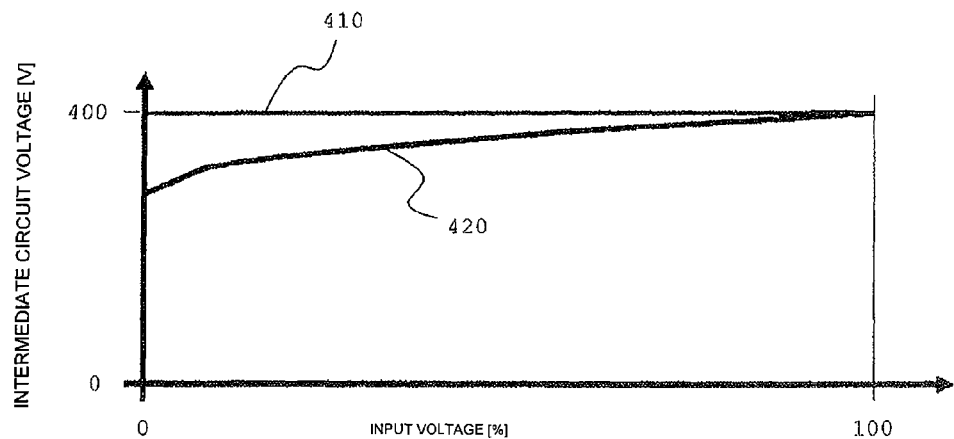
Figure 4B:
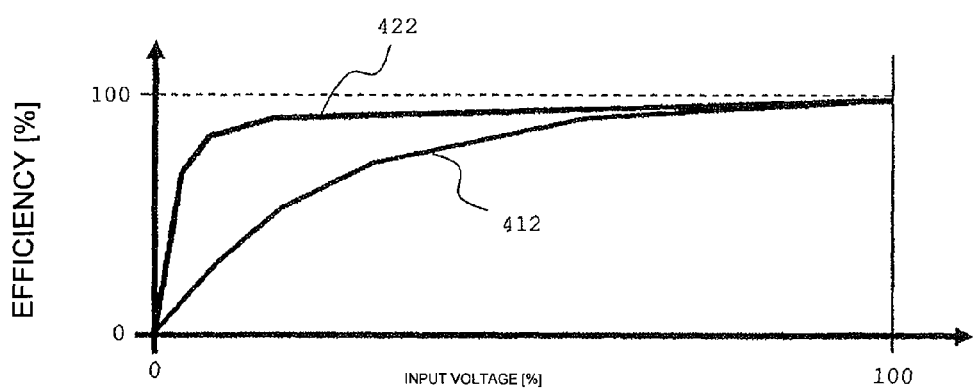

In a conventional switching power supply, a PFC regulates a constant intermediate circuit voltage, for example, 400 V d.c. voltage. This voltage must be higher than the naturally rectified voltage from the input, i.e., the network times the square root of 2; thus, the power factor correction still functions. According to the present invention, in the case of a very low network, this voltage can be lowered to a voltage which the DC/DC converter 114 can still fully stabilize, thus, e.g., to 300 V d.c. voltage. This results in an extreme improvement in efficiency, as is shown in FIGS. 4a and 4b. In FIG. 4a are shown a constant intermediate circuit voltage 410 for a conventional switching power supply and an intermediate circuit voltage 420 adapted to the input voltage according to the invention as a function of the voltage applied at the input of the respective switching power supply in percent of a maximum input voltage. In FIG. 4b are shown the efficiencies 412 and 422 that can be obtained each time as a function of the applied input voltage for a conventional switching power supply and for a switching power supply according to the invention.

After power supply 100 is put into operation at a specific temperature, a specific input voltage and a specific load, the DSP of control unit 200, after passing through a soft start with "default settings", continuously calculates all input values in real time and immediately jumps to a nearly optimal operation. The following parameters are optimized in this regard:

Switching frequency, i.e., the frequency of the pulse-width modulation signals of the outputs PWM1, PWM2 and PWM3, Set value of the intermediate circuit voltage, Phase difference or delay time between the pulse-width modulation signals of the outputs PWM1 and PWM2, Phase difference or delay time between the pulse-width modulation signals of the outputs PWM2 and PWM3, Controller parameters of the pulse-width modulation signal of output PWM1 (P, I and D component), and Controller parameters of the pulse-width modulation signal of output PWM2 (P, I and D component).

After a single stabilizing of the temperature, the DSP starts a second, very slow and higher-order control loop. The delay times between the pulse-width modulation signals of the outputs PWM1 and PWM2 are shortened in small increments until an optimal efficiency is achieved. The delay times between the pulse-width modulation signals of the outputs PWM2 and PWM3 are shortened in small increments until an optimal efficiency is achieved, the temperature always being additionally monitored for safety. After a significant change in load or input voltage, the DSP of control unit 200 first jumps back to the nearly optimal default values from the field of characteristic curves and the slow optimization process begins again. Since the second control loop is slower and of higher order than the first one, the first and second control loops form a cascade control that is controlled by control unit 200.

An absolute optimal efficiency for each working point is achieved with the method according to the invention. Conventional power supplies are only optimized at one working point, and even this point is clearly improved by the invention. The result is thus a very high efficiency over a very wide load range down to a no-load state and also over a wide range of input voltages and temperatures. Further, a very high long-term stability is achieved with high regulation performance. Also, more rapid controller effects result.

A switching power supply according to the invention is thus characterized in that the efficiency of the power supply is optimized automatically in continuous operation, and, in this way, operates optimally over the entire range of input voltages, the entire range of loads, the entire service life and the entire temperature range.

The invention claimed is:

1. A switching power supply comprising:
   input terminals that receive an input power;
   output terminals that provide an output power;
   a circuit disposed between the input and output terminals that transforms the input power to the output power, wherein the circuit includes:
   (a) a power factor correction component and a first controllable switch that controls the power factor correction component;
   (b) a D.C. voltage transformer connected downstream of the power factor correction component, and a second controllable switch that controls the D.C. voltage transformer; and
   (c) a synchronous rectifier connected downstream of the D.C. voltage transformer, and a third controllable switch that controls the synchronous rectifier;
   a first instrument that measures an input current intensity;
   a second instrument that measures an input voltage;
   a third instrument that measures an output current intensity;
   a fourth instrument that measures an output voltage; and
   a control unit connected to the first, second, third and fourth instruments, that monitors an efficiency via the first, second, third and fourth instruments and controls the efficiency by controlling, in a first control loop, the first controllable switch, the second controllable switch and the third controllable switch, by at least one pulse-width modulation signal having a variable frequency and a variable duty cycle.

2. The switching power supply according to claim 1, wherein the first controllable switch is a PID controller of the first control loop.

3. The switching power supply according to claim 1,
wherein the first controllable switch, the second controllable switch, and the third controllable switch are controlled by pulse-width modulation signals, and
wherein the pulse width modulation signals have matching frequencies and different phases.

4. The switching power supply according to claim 3, wherein the first control loop controls manipulated variables selected from the group consisting of:
the matching frequencies of the pulse-width modulation signals,
an intermediate circuit voltage produced by the power factor correction component,
the different phases of the pulse-width modulation signals between the first controllable switch and the second controllable switch,
the different phase of the pulse-width modulation signals between the second controllable switch and the third controllable switch,
and any combination thereof.

5. The switching power supply according to claim 4, further comprising:
a first additional instrument connected to the control unit for measuring the intermediate circuit voltage at an input side of the D.C. voltage transformer; and
a second additional instrument connected to the control unit and for measuring the current intensity of a current flowing at the input side of the D.C. voltage transformer.

6. The switching power supply according to claim 4,
wherein, when there is a change in the input power, the manipulated variables of the first control loop are adjusted by the control unit based on fields of characteristic curves of a circuit component selected from the group consisting of: the power factor correction component, the D.C. voltage transformer, the synchronous rectifier and any combination thereof,
wherein the power factor correction component, the D.C. voltage transformer, and the synchronous rectifier are semiconductor components, and
wherein the fields of characteristic curves are stored in the control unit.

7. The switching power supply according to claim 4,
wherein the manipulated variables of the first control loop are adjusted by the control unit based on fields of characteristic curves of a circuit component selected from the group consisting of: the power factor correction component, the D.C. voltage transformer, the synchronous rectifier, and any combination thereof, when there is a change in a load connected to the output terminals the power factor correction component,
wherein the D.C. voltage transformer and the synchronous rectifier are semiconductor components, and
wherein the fields of characteristic curves are stored in the control unit.

8. The switching power supply according to claim 1, further comprising a temperature measuring instrument that measures a temperature of the circuit of one of the first, second, and third controllable switches.

9. The switching power supply according to claim 1, further comprising a second control loop that is slower than the first control loop, the second control loop being controlled by the control unit.

10. The switching power supply according to claim 9,
wherein the control unit monitors a temperature of the circuit during an execution of the first control loop, and
wherein, when the temperature has stabilized, the second control loop establishes control.

11. The switching power supply according to claim 10, wherein the temperature is used by the control unit as a reference variable of the second control loop.

12. The switching power supply according to claim 9, wherein different phases between pulse-width modulation signals for controlling the first and second switches, and different phases between pulse-width modulation signals for controlling the second and third switches are controlled by the second control loop as manipulated variables.

13. The switching power supply according to claim 12, wherein the efficiency is used by the control unit as a reference variable of the second control loop.

14. The switching power supply according to claim 12,
wherein the manipulated variables of the second control loop are adjusted by the control unit based on fields of characteristic curves of a circuit component selected from the group consisting of: the power factor correction component, the D.C. voltage transformer, the synchronous rectifier and any combination thereof, when there is a change in the input power,
wherein the fields of characteristic curves are stored in the control unit, and
wherein the power factor correction component, the D.C. voltage transformer, and the synchronous rectifier are semiconductor components.

15. The switching power supply according to claim 12,
wherein the manipulated variables of the second control loop are adjusted by the control unit based on fields of characteristic curves of a circuit component selected from the group consisting of: the power factor correction component, the D.C. voltage transformer, the synchronous rectifier and any combination thereof, when there is a change in a load connected to the output terminals,
wherein the power factor correction component, the D.C. voltage transformer, and the synchronous rectifier are semiconductor components, and
wherein the fields of characteristic curves are stored in the control unit.

16. The switching power supply according to claim 9,
wherein the control unit monitors a temperature during an execution of the first control loop, and
wherein the second control loop establishes control when the efficiency has stabilized.

17. The switching power supply according to claim 1, wherein control unit comprises a digital signal processor.

18. The switching power supply according to claim 1, wherein the second controllable switch is a PID controller.

19. A method for operating a switching power supply comprising:
providing input power to input terminals;
transforming the input power to output power via a circuit having:
(a) a power factor correction component and a first controllable switch that controls the power factor correction component;
(b) a D.C. voltage transformer connected downstream of the power factor correction component, and a second controllable switch that controls the D.C. voltage transformer; and
(c) a synchronous rectifier connected downstream of the D.C. voltage transformer, and a third controllable switch that controls the synchronous rectifier;
measuring an input current intensity by way of a first instrument;
measuring an input voltage by way of a second instrument;
measuring an output current intensity by way of a third instrument;

measuring an output voltage by way of a fourth instrument;
monitoring an efficiency, by a control unit, via the first, second, third and fourth instruments;
controlling the efficiency, by the control unit, by controlling, in a first control loop, the first controllable switch, the second controllable switch and the third controllable switch, by at least one pulse-width modulation signal having a variable frequency and a variable duty cycle; and
providing the output power at output terminals.

* * * * *

UNITED STATES PATENT AND TRADEMARK OFFICE
CERTIFICATE OF CORRECTION

| | | |
|---|---|---|
| PATENT NO. | : 8,861,236 B2 | Page 1 of 1 |
| APPLICATION NO. | : 13/059503 | |
| DATED | : October 14, 2014 | |
| INVENTOR(S) | : Guido Remmert | |

It is certified that error appears in the above-identified patent and that said Letters Patent is hereby corrected as shown below:

On the Title Page

Under "PCT Filed",

Item (22) - please correct: "Apr. 29, 2009" to -- Aug. 28, 2009 --.

Signed and Sealed this
Fourteenth Day of April, 2015

Michelle K. Lee
*Director of the United States Patent and Trademark Office*